(12) United States Patent
Yamaguchi

(10) Patent No.: US 8,606,481 B2
(45) Date of Patent: Dec. 10, 2013

(54) DATA WRITE DEVICE AND DATA WRITE METHOD

(75) Inventor: Kazuhi Yamaguchi, Kobe (JP)

(73) Assignee: Fujitsu Ten Limited, Kobe-shi (JP)

( * ) Notice: Subject to any disclaimer, the term of this patent is extended or adjusted under 35 U.S.C. 154(b) by 455 days.

(21) Appl. No.: 12/910,095

(22) Filed: Oct. 22, 2010

(65) Prior Publication Data

US 2011/0098904 A1 Apr. 28, 2011

(30) Foreign Application Priority Data

Oct. 28, 2009 (JP) ................................. 2009-247959

(51) Int. Cl.
*G06F 17/00* (2006.01)
*B60W 30/00* (2006.01)

(52) U.S. Cl.
USPC ............................................ 701/99; 711/103

(58) Field of Classification Search
USPC .............. 701/99, 31.4, 31.6, 32.7, 32.8, 33.2, 701/33.3, 33.4, 33.5; 711/E12.001, 103, 711/E12.008
See application file for complete search history.

(56) References Cited

U.S. PATENT DOCUMENTS

| 6,718,425 | B1 * | 4/2004 | Pajakowski et al. .......... 710/315 |
| 2009/0018731 | A1 * | 1/2009 | Grenell et al. .................. 701/51 |
| 2010/0280700 | A1 * | 11/2010 | Morgal et al. ................... 701/29 |
| 2010/0281223 | A1 * | 11/2010 | Wolfe et al. ..................... 711/133 |
| 2010/0318748 | A1 * | 12/2010 | Ko et al. ......................... 711/147 |
| 2012/0079223 | A1 * | 3/2012 | Jaquette ......................... 711/162 |

FOREIGN PATENT DOCUMENTS

JP A-10-252547 9/1998

* cited by examiner

*Primary Examiner* — Jason Holloway
(74) *Attorney, Agent, or Firm* — Oliff & Berridge, PLC

(57) ABSTRACT

A data write device receives power supply from a first system guided from a power source and writes data in a nonvolatile first storage unit. A request generation unit generates a write request to write data in the first storage unit under a predetermined condition. A receiving unit receives the write request from a user. A second storage unit receives power supply from a second system guided from the power source and is able to store data. A first write unit writes target data to be written, which is stored in the second storage unit, in the first storage unit in response to the write request. A second write unit writes the target data which is stored in the second storage unit, in the first storage unit if the power supply from the first system is stopped and then restarted at the time of writing by the first write unit. A display control unit causes a display device which carries out predetermined initial display when the power supply from the first system is stopped and then restarted, to display a write result of the target data in the first storage unit. The second write unit is activated when the request generation unit generates the write request and is not activated when receiving the write request from the user.

8 Claims, 12 Drawing Sheets

FIG. 4

|  | STATE | TOOL DISPLAY |
|---|---|---|
| I | INITIAL | DEFAULT |
| II | DURING WRITE | DURING WRITE |
| III | WRITE SUCCESS | WRITE SUCCESS |
| IV | WRITE FAILURE | WRITE FAILURE |

FIG. 12

|      | STATE         | LAMP DISPLAY |
|------|---------------|--------------|
| V    | INITIAL       | TURN ON      |
| VI   | DURING WRITE  | TURN ON      |
| VII  | WRITE SUCCESS | TURN OFF     |
| VIII | WRITE FAILURE | TURN ON      |

DATA WRITE DEVICE AND DATA WRITE METHOD

The disclosure of Japanese Patent Application No. 2009-247959 filed on Oct. 28, 2009, including specification, drawings and claims is incorporated herein by reference in its entirety.

BACKGROUND

The present invention relates to a technique for a data write device which performs data write control.

In an electronic control device which controls a control target, a learning control is applied which writes, in an EEPROM in advance, a control value (learned value) in consideration of a difference (offset) between a previous target control value and an actual measured value when a control target is actually controlled on the basis of the target control value, and controls the control target on the basis of the learned value at the time of control, such that optimum control can be performed with no effect of a change with age or an individual difference of the control target.

When a CPU of the electronic control device writes a learned value in an EEPROM, a learned value based on a difference between a target control value and an actual measured value input from an external sensor of the electronic control device is calculated in a RAM serving as a working area, and the calculated learned value is written in the EEPROM.

At this time, if the system is powered off by a user or because of an abnormality, such as loose connection of a connector, the power supply from a power source to the electronic control device is stopped, thus data written in the RAM is erased. For this reason, there is a problem in that the learned value may not be written in the EEPROM.

In order to overcome this problem, an SRAM, instead of the RAM, is used in which, even when the power supply is stopped, power is constantly supplied to the RAM. That is, even when the power supply is stopped during learning, the value written in the SRAM is retained. Thus, when the power supply restarts, learning control can be continued on the basis of the retained value, making it possible to prevent the learned value from being not written in the EEPROM.

For example, Patent Document 1 describes a technique which performs learning control using an SRAM.

The learning control may be performed when the electronic control device voluntarily controls the control target, or may be performed manually when an instruction is received from an external device in accordance with a user's operation. When the electronic control device which receives an instruction from the external device performs learning control, information regarding whether the learning control has been successful or has failed can be displayed on a display section of the external device. Thus, the user can recognize the result of the operation on the display section.

Patent Document 1: JP-A-10-252547

However, if learning control is continued when the power supply restarts without distinguishing between learning control when the electronic control device controls the control target and learning control when an instruction is received from the external device, the user may misunderstand the control result due to the display content of the external device.

That is, since the power supply to the external device, which carries out predetermined initial display on the display section at the time of power-on, and the power supply to the electronic control device are made from the same power source, when the power supply restarts, information regarding whether learning control has been successful or has failed is not displayed on the display section of the external device, and predetermined initial display is carried out. Usually, while such display causes the user to recognize that learning control has failed, learning control is continued at that time, and learning control is actually successful. As a result, an error may occur between the user's recognition and the control result.

SUMMARY

It is therefore an object of at least one embodiment of the present invention to provide a technique for learning control capable of preventing a user from misunderstanding a control result.

In order to achieve at least one of the above-described objects, according to a first aspect of the embodiments of the present invention, there is provided a data write device that receives power supply from a first system guided from a power source and writes data in a nonvolatile first storage unit, the data write device comprising: a request generation unit that generates a write request to write data in the first storage unit under a predetermined condition; a receiving unit that receives the write request from a user; a second storage unit that receives power supply from a second system guided from the power source and is able to store data; a first write unit that writes target data to be written, which is stored in the second storage unit, in the first storage unit in response to the write request; a second write unit that writes the target data which is stored in the second storage unit, in the first storage unit if the power supply from the first system is stopped and then restarted at the time of writing by the first write unit; and a display control unit that causes a display device which carries out predetermined initial display when the power supply from the first system is stopped and then restarted, to display a write result of the target data in the first storage unit, wherein the second write unit is activated when the request generation unit generates the write request and is not activated when receiving the write request from the user.

With this configuration, when the power supply of the first system guided from the power source is stopped and then is restarted, if the write request is generated by the request generation unit, writing of target data is retried, and if the write request is received from the user, writing of target data is not retried. Therefore, when the power supply restarts, it is possible to prevent the user from misunderstanding between the initial display and the write result of the display device.

The display device may be a portable device which is removably attached to the data write device.

With this configuration, it is possible to prevent the user from misunderstanding due to the initial display of the portable device.

The receiving unit may receive the write request from the user through the portable device.

With this configuration, when the user operates the portable device to input the write request, it is possible to prevent the user from misunderstanding with respect to the write result.

The display device may be a display lamp which is fixedly arranged in a vehicle.

With this configuration, it is possible to prevent the user from misunderstanding due to the initial display of the display lamp.

The receiving unit may receive the write request from the user through a user operation unit which is fixedly arranged in a vehicle.

With this configuration, when the user operates the user operation unit to input the write request, it is possible to prevent the user from misunderstanding with respect to the write result.

The data write device may further comprise a control unit that performs idling stop control to automatically stop and restart an engine of a vehicle, and the target data may be learning data regarding the idling stop control.

With this configuration, it is possible to prevent the user from misunderstanding with respect to the write result of learning data regarding idling stop control.

The data write device is an electronic control device which is mounted in a vehicle.

In order to achieve at least one of the above-described objects, according to a second aspect of the embodiments of the present invention, there is provided a data write method of a data write device that receives power supply from a first system guided from a power source and writes data in a nonvolatile first storage unit, the data write method comprising: a request generation step of generating a write request to write data in the first storage unit under a predetermined condition; a receiving step of receiving the write request from a user; a first write step of writing target data to be written, which is stored in a second storage unit that receives power from a second system guided from the power source and is able to store data, in the first storage unit in response to the write request; a second write step of writing the target data which is stored in the second storage unit, in the first storage unit if the power supply from the first system is stopped and then restarted at the time of writing by the first write unit; and a display control step of causing a display device which carries out predetermined initial display when the power supply from the first system is stopped and then restarted, to display a write result of the target data in the first storage unit, wherein the second write step is carried out when the request generation unit generates the write request and is not carried out when receiving the write request from the user.

With this configuration, when the power supply of the first system guided from the power source is stopped and then is restarted, if the write request is generated by the request generation unit, writing of target data is retried, and if the write request is received from the user, writing of target data is not retried. Therefore, when the power supply restarts, it is possible to prevent the user from misunderstanding between the initial display and the write result of the display device.

BRIEF DESCRIPTION OF THE DRAWINGS

In the accompanying drawings:

FIG. 4 is a diagram showing a display content of a display section in the external device.

FIG. 12 is a diagram showing a display form of a lamp in the meter panel.

DETAILED DESCRIPTION OF THE EMBODIMENTS

The invention relates to a technique for data write control, and is widely applied to a technical field where data write control is performed. For convenience, an embodiment regarding electronic control of a vehicle will be described with reference to the accompanying drawings.

First Embodiment (System Block Diagram)

Figure 1:
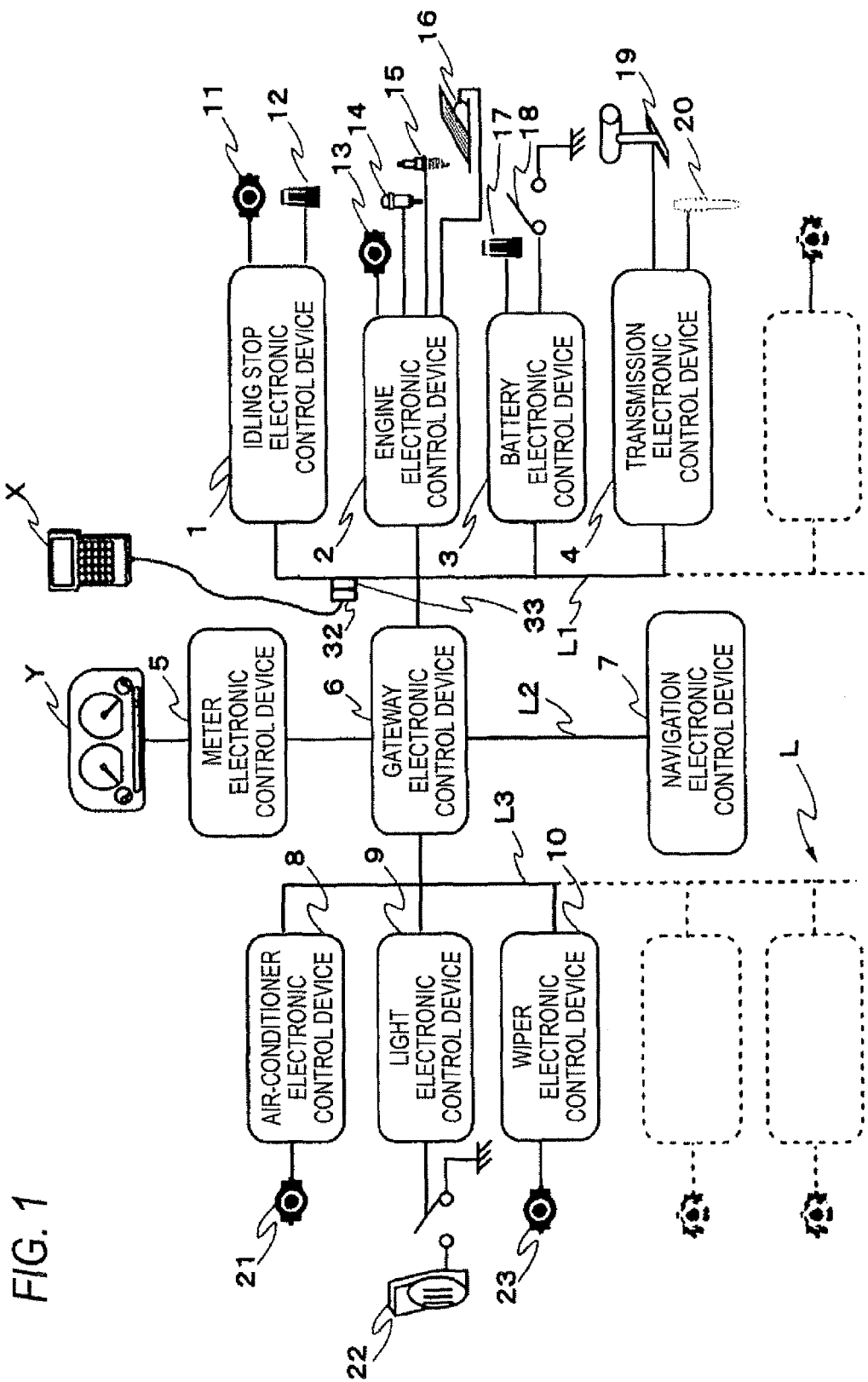
FIG. 1 is a diagram illustrating an electronic control system of a vehicle.

FIG. 1 shows an electronic control system of a vehicle according to a first embodiment. The electronic control system of the vehicle is configured such that a plurality of electronic control devices are connected to, for example, a vehicle-mounted network L, called a CAN (Control Area Network). A plurality of electronic control devices are respectively connected to control targets which are controlled by the respective electronic control devices. The electronic control devices are called, for example, ECUs (Electronic Control Unit).

Of a plurality of electronic control devices, a gateway electronic control device 6 relays a plurality of vehicle-mounted networks, and performs traffic control of data to be transmitted between a plurality of vehicle-mounted networks. A plurality of vehicle-mounted networks includes a power network L1 which is connected to electronic control devices involved in traveling of the vehicle, an information network L2 which is connected to electronic control device involved in information provision, a body network L3 which is connected to electronic control devices involved in electric components, and the like. A meter electronic control device 5 is separately connected to the gateway electronic control device 6.

Electronic control devices, such as an idling stop electronic control device 1, an engine electronic control device 2, a battery electronic control device 3, and a transmission electronic control device 4, are connected to the power network L1.

In the idling stop electronic control device 1, a control section mainly controls a starter motor 11 serving as a control target for assisting a rotation force at the time of cranking control of the engine of the vehicle on the basis of an input value from an engine rotation number sensor 12 or the like. In the engine electronic control device 2, a control section mainly controls a throttle motor 13, an injector 14, and a spark plug 15 serving as a control target for controlling engine torque on the basis of an input value from an accelerator sensor 16 or the like. In the battery electronic control device 3, a control section mainly controls a switch 18 serving as a control target for charging and discharging power on the basis of an input value from a voltage sensor 17 of a battery or the like. In the transmission electronic control device 4, a control section mainly controls a solenoid 20 or the like serving as a control target for gear shifting on the basis of an input value from a gear sensor 19 or the like connected to a gear shifting lever.

A navigation electronic control device 7 or the like is connected to the information network L2.

In the navigation electronic control device 7, a control section mainly performs display control of position data received from a GPS satellite and map data stored in a storage section on a display section serving as a control target.

An air-conditioner electronic control device 8, a light electronic control device 9, and a wiper electronic control device 10 are connected to the body network L3.

In the air-conditioner electronic control device 8, a control section mainly controls a motor 21 serving as a control target for adjusting air in the interior of the vehicle on the basis of an input value from a temperature sensor or the like. In the light electronic control device 9, a control section mainly performs lighting control of a headlight 22 or the like serving as a control target on the basis of a signal which is turned on in accordance with a user's operation. In the wiper electronic control device 10, a control section mainly controls a wiper motor 23 serving as a control target on the basis of a signal which is turned on in accordance with a user's operation.

In a meter electronic control device 5 which is separately connected to the gateway electronic control device 6, a control section performs display control on a vehicle speed meter or an engine rotation number meter serving as a control target on the basis of an input value transmitted from each electronic control device or an input value from each sensor.

An external device X is configured such that a cable-side connector 32 provided in the external device X is connected to a vehicle-mounted network-side connector 33 of the power network. The external device X receives a user's operation, and causes the electronic control device connected to the vehicle-mounted network L1 to perform control according to the operation. That is, the external device X refers to a display device which is removably attached to the electronic control system of the vehicle.

(Electronic Control Device)

Figure 2:
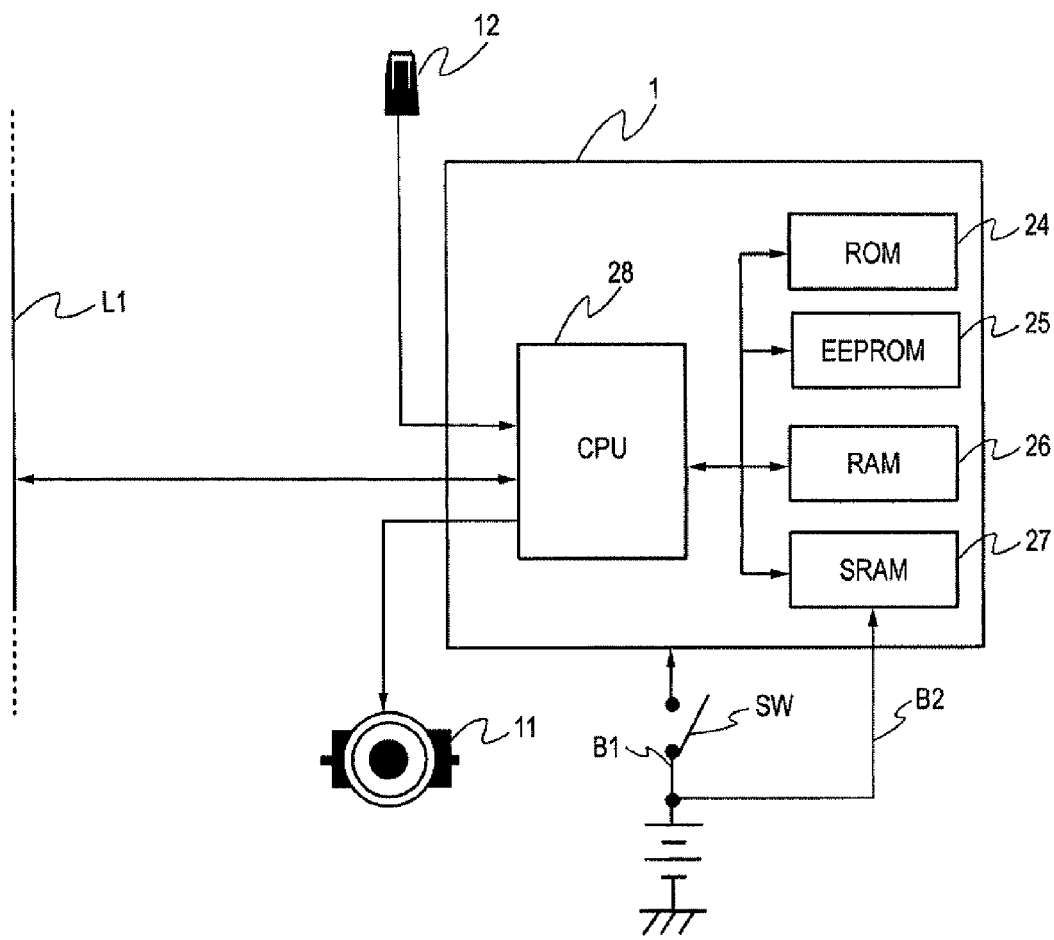
FIG. 2 is a system block diagram of an electronic control device.

Although the technique of this embodiment is applied to any electronic control device, for convenience, an example where the technique is applied to the idling stop electronic control device 1 will be described with reference to the accompanying drawings. FIG. 2 shows the system blocks of the idling stop electronic control device 1.

The idling stop electronic control device 1 includes a ROM 24 which servers as a nonvolatile storage section to write a control program for exhibiting an idling stop function, an EEPROM 25 which serves as a writable and erasable nonvolatile storage section, that is, a first storage section, in which a learning control value or control history data is written, a RAM 26 which serves as a volatile storage section in which a value is temporarily written during an arithmetic operation of a control section, an SRAM (STANDBY RAM) 27 which serves as a nonvolatile storage section, that is, a second storage section, in which data written in the EEPROM 25 or the like is written as backup data, and to which power is supplied from a second system B2 guided from the power source B, and a CPU 28 which serves a control section to drive and control the starter motor 11 on the basis of a control program written in the EEPROM 25 and an input signal from the sensor 12 or the vehicle-mounted network L, and exhibits a function to receive a data write request and to write data in the EEPROM 25 or the SRAM 27, or a function to output the data write request on the basis of the control program.

The idling stop electronic control device 1 is supplied with power from a first system B1 guided from a power source B and exhibits an idling stop function described below. The first system B1 carries out power supply to the electronic control devices, such as the idling stop electronic control device 1 and the like, when the user operates a user switch SW, such as an ignition switch or a push start switch, and the vehicle control system is activated. Meanwhile, a second system B2 carries out power supply to the SRAM regardless of the operation of the user switch SW.

(Idling Stop Function)

The idling stop function refers to a function which, with regard to engine control for suppressing fuel consumption, during a period from when the engine starts in accordance with an operation of the user switch SW until the engine is stopped in accordance with an operation of the user switch SW by the user, stops the engine if the condition that the vehicle speed becomes zero and the vehicle is stopped is satisfied, and starts the engine if the condition that an accelerator operation of the user is detected later is satisfied. This function is exhibited by the CPU 28 of the idling stop electronic control device 1 in cooperation with control elements, such as other electronic components or other electronic control devices.

(External Device)

Figure 3:
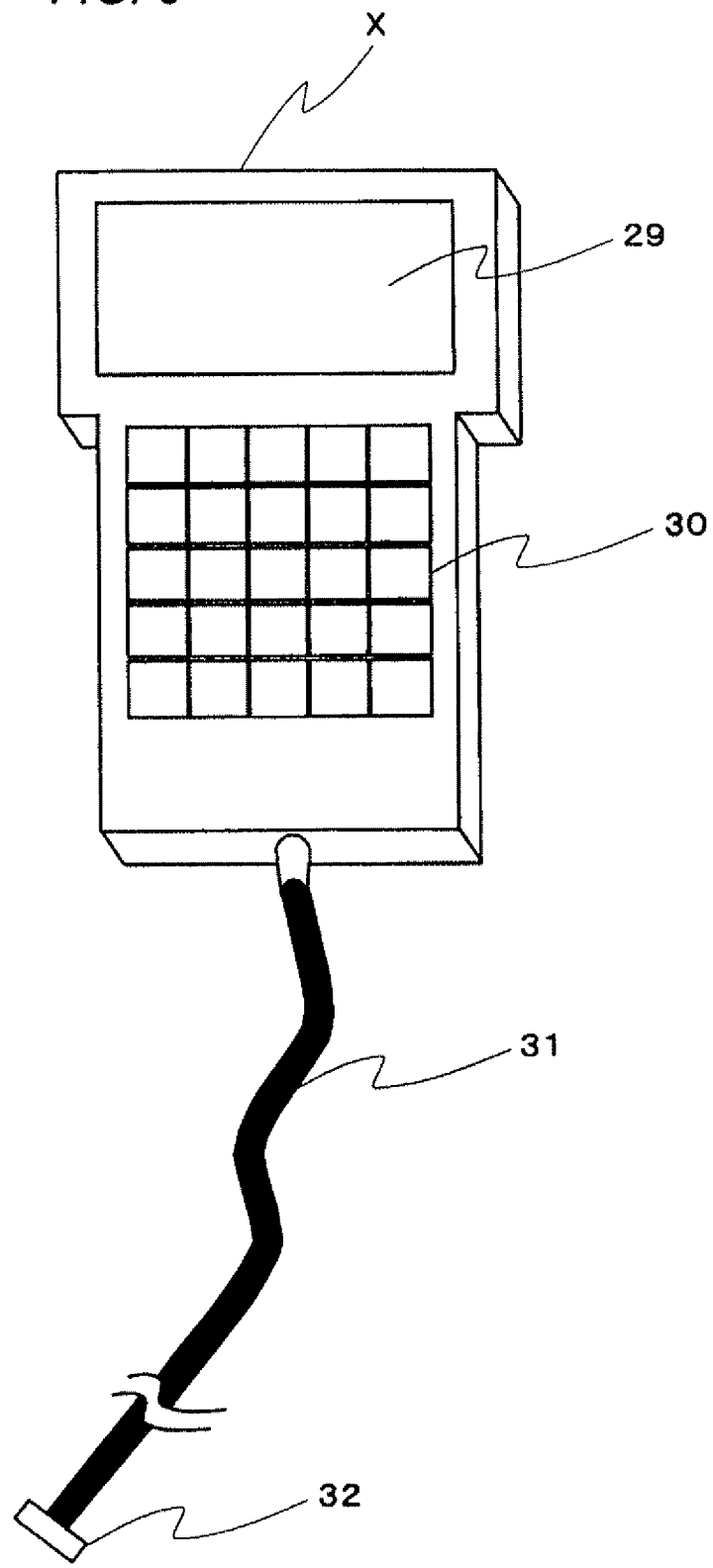
FIG. 3 is a diagram showing an external device.

FIG. 3 shows the external device X. The external device X (for example, a scan tool) includes an operation section 30 which receives a data write request from the user, a display section 29 which displays the write result of the data write request, a control section which outputs the content received by the operation unit 30 to each electronic control device and also outputs the write result or the like to the display section 29, a connection cable 31 which connects the external device X and the electronic control system of the vehicle, and a cable-side connector 32 which connects the connection cable 31 and the connector 33 of the vehicle-mounted network L of the electronic control system of the vehicle.

The control section provided in the external device X causes an electronic control device designated by the user through the operation section 30 to perform learning control and to write a learned value in the EEPROM 25, or directly writes data in the EEPROM 25. When the user causes the idling stop electronic control device 1 to perform learning control and to write the learned value in the EEPROM 25 through the external device X, the user inputs an ID code designating the idling stop electronic control device 1 and a learning/write control code for learning control through the operation section 30 of the external device X. The input codes are received by the operation section 30, the control section outputs the ID code and the learning/write control code to the vehicle-mounted network L.

Next, a network driver of the idling stop electronic control device 1 recognizes the idling stop electronic control device 1 as a destination on the basis of ID code data transmitted to the vehicle-mounted network L1, and loads the learning/write control code associated with the ID code. The CPU 28 of the idling stop electronic control device 1 performs learning control on the basis of the loaded learning/write control code and writes the learned value in the EEPROM, and if writing is completed, also outputs data of the write result and an ID code designating the external device X to the vehicle-mounted network L1.

Meanwhile, if the external device X recognizes the external device X as a destination on the basis of ID code data transmitted to the vehicle-mounted network L1, write result data associated with the ID code is loaded, and the control section of the external device X outputs the write result to the display section 29.

The content which is displayed on the display section 29 by the control section of the external device X will be described with reference to FIG. 4. The external device X is supplied with operational power from the power source of the vehicle. For this reason, in a state where the electronic control system of the vehicle is powered on in accordance with an operation of the user switch SW by the user, the cable-side connector 32 of the external device X is connected to the connector 33 of the vehicle-mounted network L1. Thus, the external device X is supplied with power and is operated. If power is supplied to the external device X, the control section of the external device X causes the display section 29 to display a predetermined initial screen. That is, in an initial state where power is supplied to the external device X, an initial screen indicated by I in FIG. 4 is displayed on the display section 29.

The external device X outputs a write request based on a user's operation to the idling stop electronic control device 1. While the idling stop electronic control device 1 is writing, "during write" indicated by II in FIG. 4 is displayed on the display section 29.

The external device X outputs a write request based on a user's operation to the idling stop electronic control device 1, and causes the display section 29 to display "write success" indicated by III in FIG. 4 on the basis of data indicating normal write completion transmitted when the idling stop electronic control device 1 has normally completed writing.

The external device X outputs a write request based on a user's operation to the idling stop electronic control device 1, and causes the display section 29 to display "write failure" indicated by IV in FIG. 4 on the basis of data indicating abnormal write completion transmitted when the idling stop electronic control device 1 has not normally completed writing. Therefore, the function of the CPU 28 of the idling stop electronic control device 1 to output write result data to the vehicle-mounted network L may be regarded as a display function.

(Learning/Write Control)

Types of learning/write control performed by the CPU 28 of the idling stop electronic control device 1 includes learning/write control by the vehicle control program and learning/write control by a user's command. Hereinafter, these types will be separately described.

(Learning/Write Control by Vehicle Control Program)

The learning/write control by the vehicle control program which is carried out by the CPU 28 of the idling stop electronic control device 1 means that, for example, when a period from when the engine starts in accordance with an operation of the user switch SW by the user until the engine is stopped in accordance with an operation of the user switch SW by the user is referred to as one time (one trip), each time the number of trips exceeds a predetermined number of times (for example, 50 times), control for writing, in the EEPROM in advance, a control value (learned value) in consideration of a difference (offset) between a previous target control value and an actual measured value when a control target is actually controlled on the basis of the target control value is carried out concurrently with vehicle control. The idling stop electronic control device 1, the electronic control system of the vehicle, and the vehicle which are in charge of such a function may be regarded as a data write device.

Thus, it is possible to prevent a control result from differing from the target control value due to a change with age, and to obtain an accurate control result even when a control target is deteriorated due to a change with age.

There is also control which is performed by the CPU 28 on the basis of the vehicle control program which is written in the ROM 24 to learn the origin of a sensor (for example, a G sensor) for measuring the gradient of an area where the vehicle is located and writes the learned value in the EEPROM each time the number of trips exceeds a predetermined number of times (for example, 50 times).

(Learning/Write Control by User's Command)

With regard to the learning/write control by a user's command, the user operates the external device X connected to the idling stop electronic control device 1 through the vehicle-mounted network L, and causes the idling stop electronic control device 1 to perform desired learning/write control. For example, when the idling stop electronic control device 1 is out of order and is replaced with a new idling stop electronic control device 1 by a dealer shop or in a repair shop, the user carries out the above-described operation through the external device X, and causes the idling stop electronic control device 1 to perform desired learning/write control.

Types of the learning/write control desired by the user include the above-described learning/write control which calculates a value by learning the difference between the previous target control value and the actual measured value when the control target is actually controlled on the basis of the target control value and writes the value in the EEPROM 25, the learning/write control of the origin of the G sensor, and the like.

(Write Control by User's Command)

Write control by a user's command means that the user operates the external device X connected to the idling stop electronic control device 1 through the vehicle-mounted network L, and write control desired by the user is performed. For example, when the idling stop electronic control device 1 is out of order and is replaced with a new idling stop electronic control device 1 in a dealer shop or a repair shop, control is performed in which the user carries out the above-described operation through the external device X to write the learned value or parameters, which are written in the EEPROM 25 of the previous idling stop electronic control device 1, in the idling stop electronic control device 1.

Data which is written in the idling stop electronic control device 1 by the user includes the number of drive times of the starter motor 11. The user carries out the above-described operation through the external device X to write the number of drive times of the starter motor 11, which is read from the previous idling stop electronic control device 1, in the EEPROM 25 of the replaced idling stop electronic control device 1.

The number of drive times of the starter motor 11 is used for control in which the idling stop function in the idling stop electronic control device 1 is invalidated when the number of drive times is equal to or greater than a predetermined number of times (for example, three hundred sixty thousand times), and the life of the starter motor 11 comes to an end.

(Learning/Write Control Main Routine)

Hereinafter, the details of the above-described learning/write control will be described with reference to FIGS. 5, 6, 7, and 8.

Figure 5:
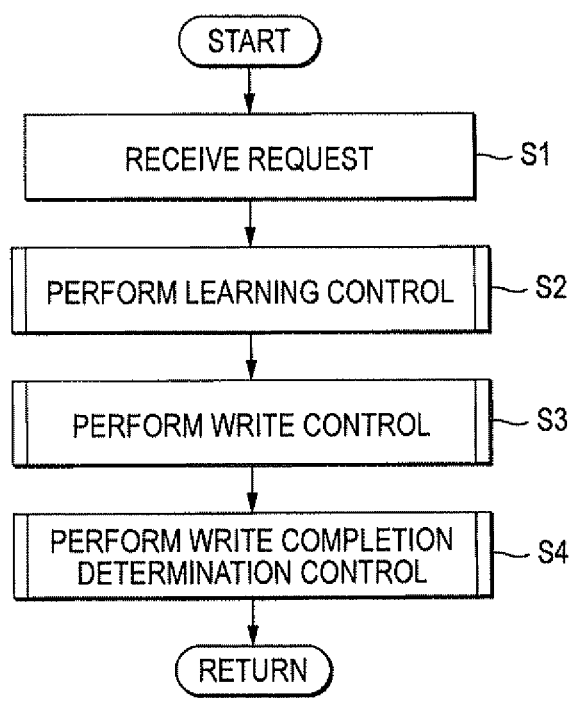
FIG. 5 is a flowchart showing a control content.

FIG. 5 is a diagram showing a main routine in which a write request is generated and learning control, write control, and write completion determination control are performed on the basis of the generated write request by either the learning/write control by the vehicle control program or the learning/write control by the user's command.

The CPU 28 of the idling stop electronic control device 1 carries out the main routine of FIG. 5 on the basis of an output write request by either the learning/write control by the vehicle control program or the learning/write control by the user's command.

In the case of the learning/write control by the vehicle control program, the output of the write request means that the write request is output under control performed by the CPU 28 of the idling stop electronic control device 1 in accordance with the vehicle control program. In the case of the learning/write control by the user's command, the output of the write request means that the external device X outputs the write request to the idling stop electronic control device 1 through the vehicle-mounted network L in accordance with a user's operation.

If the main routine of FIG. 5 is carried out, the CPU 28 of the idling stop electronic control device 1 determines whether or not the write request is received (Step S1). It is determined whether the write request indicates that writing can be carried out by the idling stop electronic control device 1 or that writing can be carried out with a control timing.

Next, when the received write request requests predetermined learning/write control, the CPU 28 of the idling stop electronic control device 1 performs the predetermined learning control (Step S2). When the write request received by the CPU 28 requests predetermined write control, Step S2 will be omitted.

Next, the CPU 28 of the idling stop electronic control device 1 performs write control to write a learned value learned by learning control in the EEPROM 25 (Step S3). When the write request received by the CPU 28 requests predetermined write control, control is performed to write data representing the write content associated with the write request in the EEPROM 25.

Next, the CPU 28 of the idling stop electronic control device 1 performs control to determine whether or not the write control is normally completed (Step S4).

Figure 6:
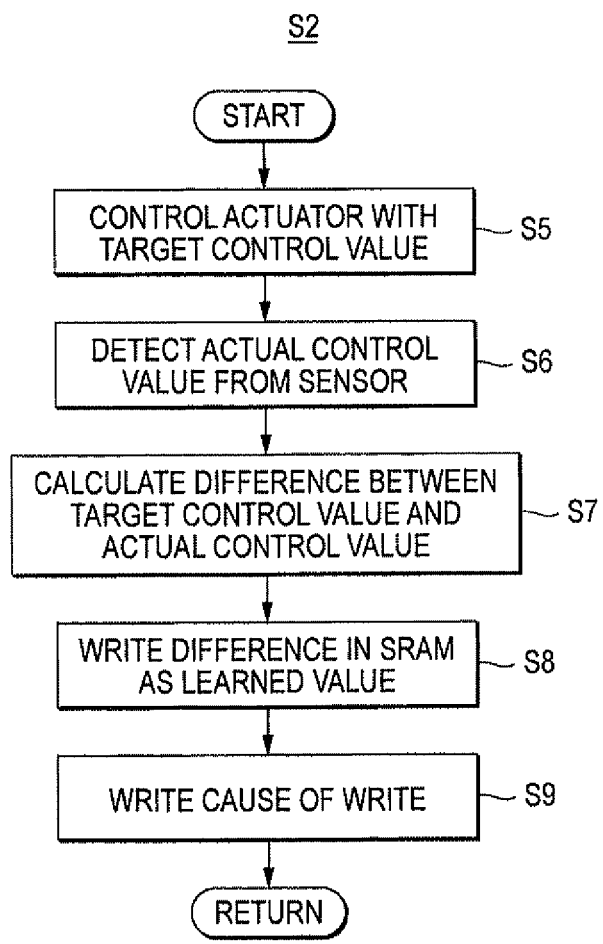
FIG. 6 is a flowchart showing a control content.
Figure 7:
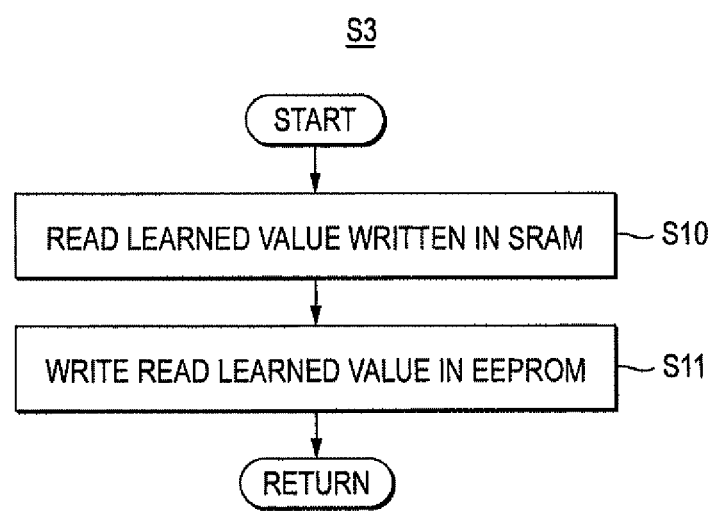
FIG. 7 is a flowchart showing a control content.
Figure 8:
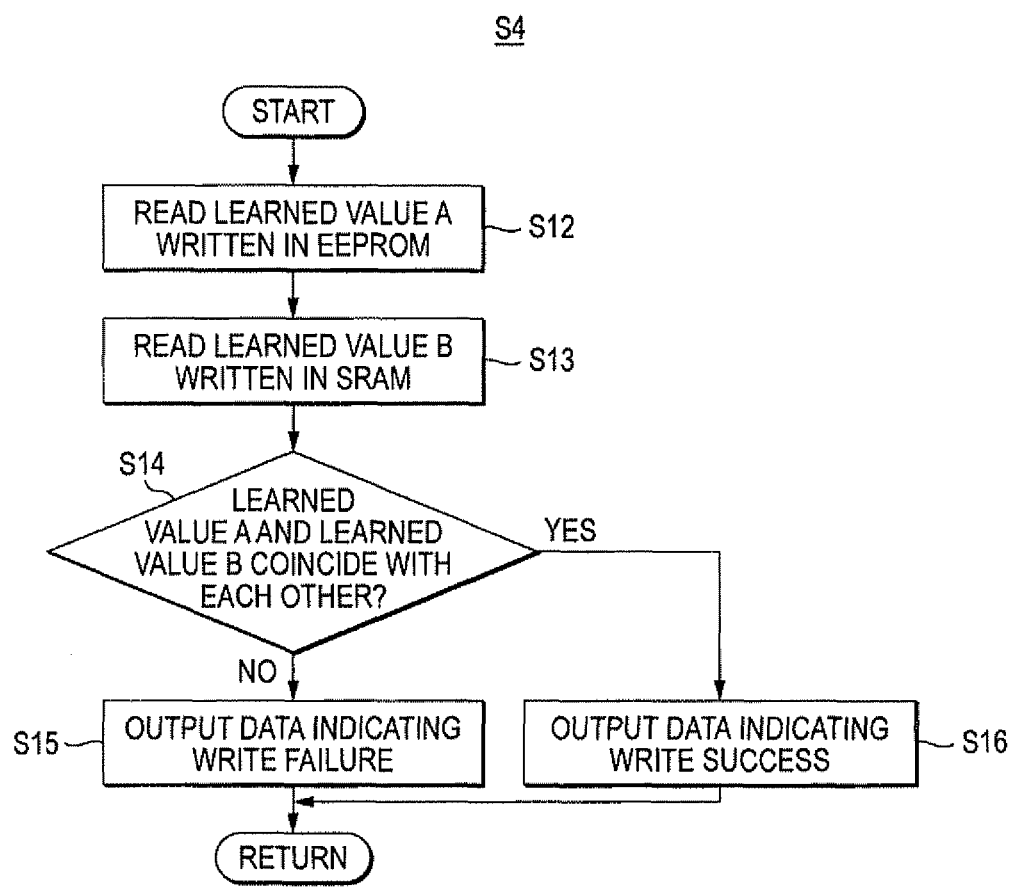
FIG. 8 is a flowchart showing a control content.

Hereinafter, the details (of each subroutine) from Step S2 to Step S4 will be described with reference to FIGS. 6, 7, and 8.

(Learning Control Subroutine)

The detailed control of the learning control subroutine of Step S2 shown in FIG. 5 will be described with reference to FIG. 6. In particular, when the received write request indicates, for example, control in which a control value (learned value) in consideration of the difference (offset) between the previous target control value and an actual measured value when a control target is actually controlled on the basis of the target control value is written in the EEPROM 25 in advance, learning control which is performed by the CPU 28 of the idling stop electronic control device 1 will be described.

The CPU 28 of the idling stop electronic control device 1 controls an actuator on the basis of a target control value which is a desired operation amount of the actuator (Step S5).

Next, the CPU 28 of the idling stop electronic control device 1 detects an operation result of the actuator which is controlled in accordance with the target control value, that is, an actual control value from a sensor which detected the operation amount (Step S6).

Next, the CPU 28 of the idling stop electronic control device 1 calculates the difference (offset value) between the target control value and the actual control value, and writes the calculated offset value in the SRAM (Step S7).

Next, the CPU 28 of the idling stop electronic control device 1 writes the offset value in the SRAM 27 as a learned value (Step S8). This control which is performed by the CPU 28 may be regarded as a first write unit.

Next, the CPU 28 of the idling stop electronic control device 1 writes, in the SRAM 27, a cause of write representing whether a cause for which the write request of the learned value is output is the learning/write control of the vehicle control program or the learning/write control by the user's command (Step S9).

When the write request received by the CPU 28 requests predetermined write control, Steps S5 to S8 will be omitted, and Step S9 is instead carried out in which control is performed to write data representing the write content associated with the write request in the SRAM 27.

(Write Control Subroutine)

The detailed control of the write control subroutine of Step S3 shown in FIG. 5 will be described with reference to FIG. 7.

The CPU 28 of the idling stop electronic control device 1 reads the written learned value from the SRAM 27 (Step S10). When the write request received by the CPU 28 requests predetermined write control, the CPU 28 reads the written content from the SRAM 27.

Next, the CPU 28 of the idling stop electronic control device 1 writes the learned value read from the SRAM 27 in the EEPROM 25 as a first write operation (Step S11). When the write request received by the CPU 28 requests predetermined write control, the CPU 28 writes the content read from the SRAM 27 in the EEPROM 25.

(Write Completion Determination Control Subroutine)

The detailed control of the write completion determination control subroutine of Step S4 shown in FIG. 5 will be described with reference to FIG. 8.

The CPU 28 of the idling stop electronic control device 1 reads the learned value written in the EEPROM 25 (Step S12). The read learned value is defined as a learned value A.

Next, the CPU 28 of the idling stop electronic control device 1 reads the learned value written in the SRAM 27 (Step S13). The read learned value is defined as a learned value B.

Next, the CPU 28 of the idling stop electronic control device 1 determines whether or not the learned value A and the learned value B coincide with each other (Step S14). When the determination is made that the learned value A and the learned value B coincide with each other (YES in Step S14), the process progresses to Step S15. When the learned value A and the learned value B do not coincide with each other (NO in Step S14), the process progresses to Step S16.

Next, in Step S14, when the CPU 28 of the idling stop electronic control device 1 determines that the learned value A and the learned value B coincide with each other, an ID code indicating that the external device X is a destination and data as write result data indicating that the write control has been successful are output to the vehicle-mounted network L through the vehicle-mounted network driver (Step S15).

Next, in Step S14, when the CPU 28 of the idling stop electronic control device 1 determines that the learned value A and the learned value B do not coincide with each other, an ID code indicating that the external device X is a destination and data as write result data indicating that the write control has failed are output to the vehicle-mounted network L through the vehicle-mounted network driver (Step S16).

That is, in Steps S15 and S16, the CPU 28 of the idling stop electronic control device 1 transmits write result data to the vehicle-mounted network L may be regarded to as function to display write result data on the display section 29 of the external device X.

As described above, if the external device X recognizes the external device X as a destination from ID code data transmitted to the vehicle-mounted network L, the external device X loads write result data associated with the ID code, and the control section of the external device X outputs the write result to the display section 29.

When the write request received by the CPU 28 requests predetermined write control, the write content written in the EEPROM 25, instead of the learned value A in the write completion determination control subroutine, is defined as data A, and the write content written in the SRAM 27, instead of the learned value B, is defined as data B.

When learning control or write control is performed by the vehicle control program, this control is not performed by the user, thus it is not necessary to notify the user of information regarding the control. Therefore, the CPU 28 of the idling stop electronic control device 1 does not output write result data to the vehicle-mounted network L.

(Power Supply Stoppage)

When the vehicle system is stopped in accordance with an operation of the user switch SW and the power supply from the first system B1 guided from the power source of the vehicle to the idling stop electronic control device 1 is stopped while the CPU 28 of the idling stop electronic control device 1 is performing the above-described learning control or write control, or when the connector is removed from the first system B1 guided from the power source of the vehicle to the idling stop electronic control device 1 with a repair/replacement operation of the user, and the power supply from the first system B1 is stopped while the learning control or write control is being performed, the CPU 28 stops the learning control or the write control halfway.

In this case, the SRAM 27 is supplied with power from the second system B2, and the content written in the SRAM 27 is retained.

As described above, the external device X is supplied with operational power from the power source of the vehicle. For this reason, in a state where the electronic control system of the vehicle is powered on in accordance with an operation of the user switch SW by the user, and the cable-side connector 32 of the external device X is connected to the connector 33 of the vehicle-mounted network L1, the external device X is supplied with power and is operated. If power is supplied to the external device X, the control section of the external device X causes the display section 29 to display a predetermined initial screen. That is, in an initial state where power is supplied to the external device X, an initial screen indicated by 1 in FIG. 4 is displayed on the display section 29.

(Retry Control)

When the user operates the user switch SW, and power is supplied from the first system B1 guided from the power source to the idling stop electronic control device 1, the CPU 28 of the idling stop electronic control device 1 performs retry control.

The retry control refers to control in which, when power is supplied from the first system B1 guided from the power source to the idling stop electronic control device 1, the idling stop electronic control device 1 is activated, and when initialization control is performed at the time of the activation, the CPU 28 performs the learning control or write control, which has been stopped halfway, from the beginning again, or performs the interrupted learning control or write control from immediately after having been interrupted, such that the write control is reliably performed. The details of the retry control will be described with reference to FIGS. 9 and 10.

(Vehicle Control Main Routine)

A vehicle control main routine when the user operates the user switch SW, and power is supplied from the first system B1 guided from the power source to the idling stop electronic control device 1 to activate the idling stop electronic control device 1 will be described with reference to FIG. 9.

Figure 9:
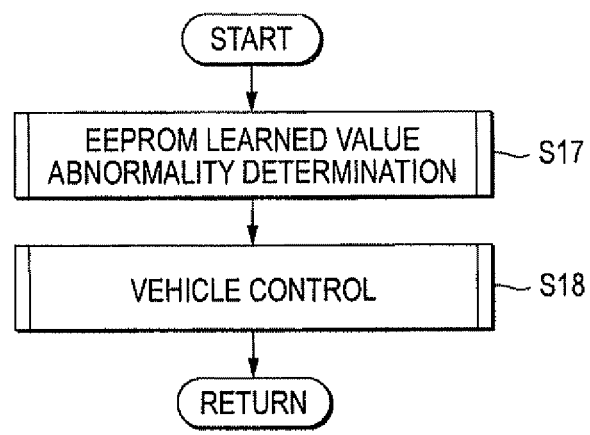
FIG. 9 is a flowchart showing a control content.

An EEPROM write value abnormality determination control subroutine of Step S17 shown in FIG. 9 is a part of initialization processing which is carried out by the CPU 28 of the idling stop electronic control device 1.

In a vehicle control subroutine of Step S18 shown in FIG. 9, the CPU 28 of the idling stop electronic control device 1 carries out the above-described idling stop function. When the user operates the user switch SW and the vehicle system is powered off, the vehicle control subroutine ends, and the vehicle control ends.

(EEPROM Write Value Abnormality Determination Control Subroutine)

Figure 10:
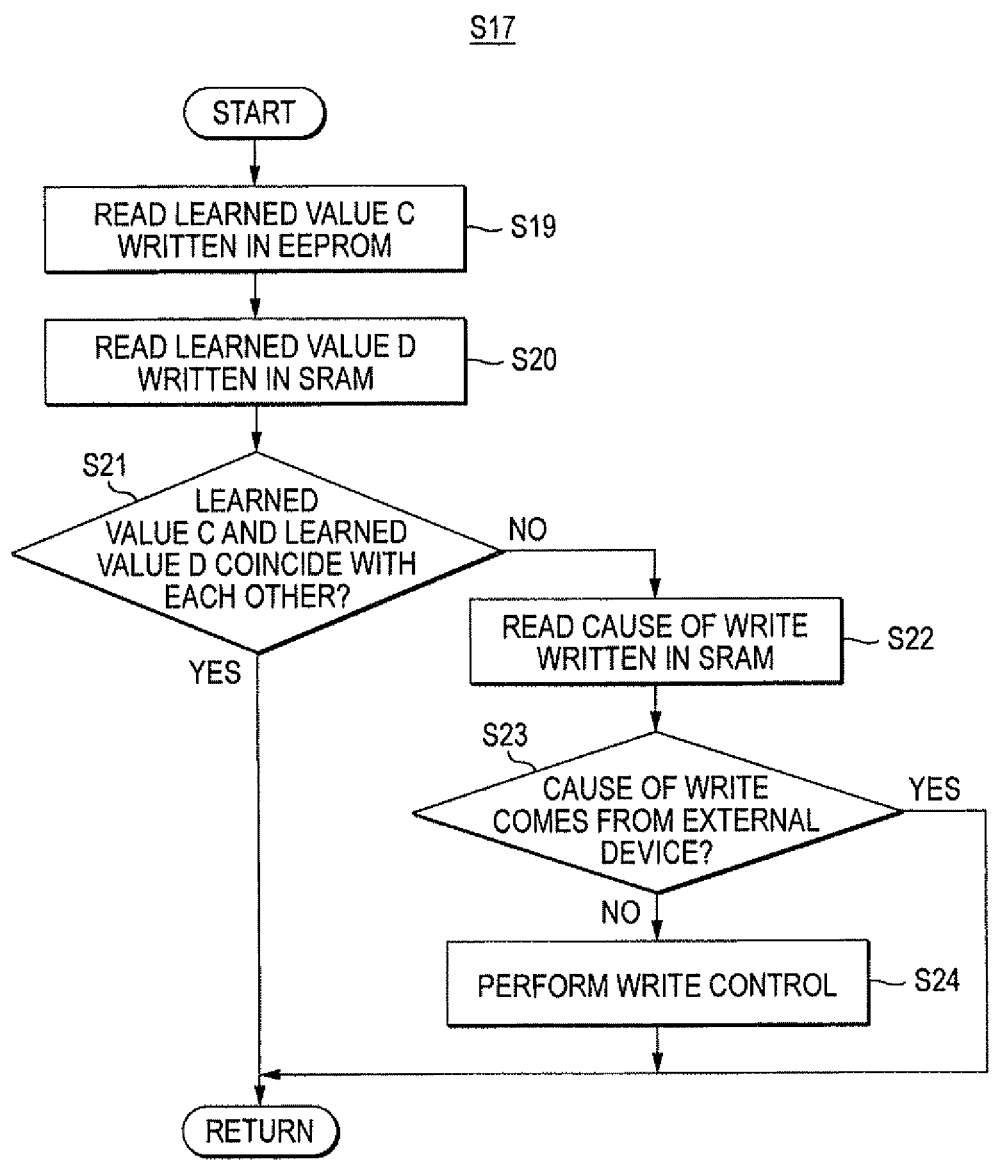
FIG. 10 is a flowchart showing a control content.

The detailed control of the EEPROM write value abnormality determination control subroutine of Step S17 shown in FIG. 9 will be described with reference to FIG. 10.

The CPU 28 of the idling stop electronic control device 1 reads a learned value written in the EEPROM 25 (Step S19). The read learned value is defined as a learned value C.

Next, the CPU 28 of the idling stop electronic control device 1 reads a learned value written in the SRAM 27 (Step S20). The read learned value is defined as a learned value D.

Next, the CPU 28 of the idling stop electronic control device 1 determines whether or not the learned value C and the learned value D coincide with each other (Step S21). When the determination is made that the learned value C and the learned value D coincide with each other (YES in Step S21), the subroutine returns. When the learned value C and the learned value D do not coincide with each other (NO in Step S21), the process progresses to Step S22.

That is, with regard to the incoincidence of the learned value A and the learned value B, it is estimated that, when the user operates the user switch SW to stop the engine and to end the vehicle system, the CPU 28 of the idling stop electronic control device 1 has failed learning/write control or write control. In other words, it is estimated that the user operates the user switch SW to end the vehicle system while the CPU 28 of the idling stop electronic control device 1 is performing learning/write control or write control, and the CPU 28 interrupts the control.

Next, in Step S21, when it is determined that the learned value C and the learned value D do not coincide with each other, the CPU 28 of the idling stop electronic control device 1 reads a cause of write written in the SRAM 27 representing whether a cause for which the write request of the learned value is output is due to the learning/write control by the vehicle control program or the learning/write control by the user's command (Step S22).

Next, the CPU 28 of the idling stop electronic control device 1 determines whether or not the cause of write read in Step S22 is due to the user's command (Step S23). When the cause of write is not due to the user's command (NO in Step S23), the CPU 28 of the idling stop electronic control device 1 progresses to Step S24.

Next, in Step S23, when the cause of write is not due to the user's command (NO in Step S23), the process progresses to Step S24, and write control is performed as a second write operation. That is, the CPU 28 performs the above-described retry control. In other words, the CPU 28 validates a retry function.

Next, in Step S23, when the cause of write is due to the user's command, the subroutine returns. That is, the CPU 28 does not perform the above-described retry control. In other words, the CPU 28 does not validate the retry function.

Thus, even when the learning/write control by the vehicle control program is interrupted, the CPU 28 of the idling stop electronic control device 1 performs the retry control to improve the reliability of the learning/write control. After the learning/write control by the user's command is interrupted, the retry control is not performed, and, when the external device X is supplied with power from the vehicle, a predetermined initial screen is displayed on the display section 29. Therefore, it is possible to suppress the inconsistency between the failure of the learning/write control analyzed by the user and the actual control content.

When the write request received by the CPU 28 requests predetermined write control, data E representing the write content written in the EEPROM 25 is used instead of the learned value C in the EEPROM write value abnormality determination control subroutine, and data F representing the write content written in the SRAM 27 is used instead of the learned value D.

Meanwhile, when the learning control or write control by the vehicle control program is performed, since this control is not performed by the user, it is not necessary to notify the user of information regarding the control. Therefore, the CPU 28 of the idling stop electronic control device 1 does not output write result data to the vehicle-mounted network L.

Second Embodiment

Although the embodiment of the invention has been described, the invention is not limited to the foregoing embodiment, and various modifications may be made.

<Modification 1>

Although in the representative embodiment, a case has been described where the electronic control device is the idling stop electronic control device 1, the electronic control device may be implemented by the engine electronic control device 2, the battery electronic control device 3, the transmission electronic control device 4, the meter electronic control device 5, the gateway electronic control device 6, the navigation electronic control device 7, the air-conditioner electronic control device 8, the light electronic control device 9, the wiper electronic control device 10, or another electronic control device.

<Modification 2>

In the first embodiment, a case has been described where, with regard to the learning/write control by the user's command, the user operates the external device X connected to the idling stop electronic control device 1 and causes the electronic control device, such as the idling stop electronic control device 1, to perform learning/write control desired by the user. Alternatively, the user may carry out a predetermined manual operation through an operation unit which is fixedly provided in the vehicle, and may cause the electronic control device, such as the idling stop electronic control device 1, to perform learning/write control desired by the user. For example, in a state where the user operates the user switch SW to activate the vehicle system or yanks the emergency brake to stop the vehicle, a predetermined operation including a brake operation or a gear shifting lever operation causes a predetermined electronic control device to perform predetermined learning/write control.

Figure 11:
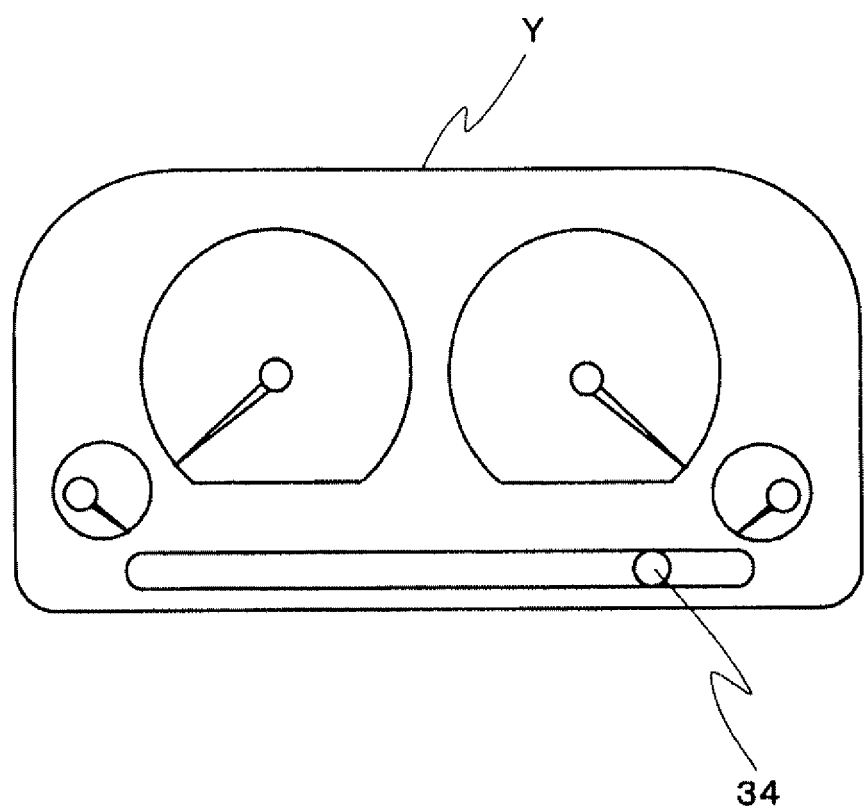
FIG. 11 is a diagram showing a meter panel.

In Modification 2, a display method of a control result to notify the control result to the user is display of a lamp 34 of a meter panel Y shown in FIG. 11. With regard to display of the lamp which is fixedly arranged in the vehicle, control result data received from the meter electronic control device 5, which performs learning/write control, through the vehicle-mounted network L is displayed as shown in FIG. 12. That is, when the user switch SW is operated and the vehicle system is powered on, the meter electronic control device 5 turns on the lamp 34 for a predetermined time (for example, five seconds) as an initial state indicated by V in FIG. 12.

When a write request is output to an electronic control device in accordance with a manual operation and the electronic control device carries out writing, the meter electronic control device 5 turns on the display lamp 34 as indicated by VI in FIG. 12.

When a write request is output to an electronic control device in accordance with a manual operation, the meter electronic control device 5 turns off the display lamp 34 as indicated by VII in FIG. 12 on the basis of data indicating normal write completion transmitted when the electronic control device has normally completed writing.

When a write request is output to an electronic control device in accordance with a manual operation, the meter electronic control device 5 turns on the lamp 34 as indicated by VII in FIG. 12 on the basis of data indicating abnormal write completion transmitted when the electronic control device has not normally completed writing.

Although in the foregoing embodiments, a case has been described where various functions are implemented by software through the arithmetic processing of the CPU based on the program, some of the functions may be implemented by electrical hardware. Meanwhile, some of functions which are implemented by hardware circuits may be implemented by software.

Although in the flowcharts illustrating control of the respective embodiments, for convenience, the processing is shown in a single train, the control section may use the multitask control function to carry out the segmented processing in parallel.

What is claimed is:

1. A data write device that receives power supply from a first system guided from a power source and writes data in a nonvolatile first storage unit, the data write device comprising:
   a second storage unit that receives power supply from a second system guided from the power source and is able to store data; and
   a processor that executes control logic to perform the functions of:
      a request generation unit that generates a write request to write data in the first storage unit under a predetermined condition;
      a receiving unit that receives the write request from a user;
      a first write unit that writes target data stored in the second storage unit in the first storage unit in response to the write request,
      a second write unit that writes the target data stored in the second storage unit in the first storage unit if the power supply from the first system is stopped and then restarted at the time of writing by the first write unit; and
      a display control unit that causes a display device to display a write result of the target data in the first storage unit, wherein
         the display device carries out a predetermined initial display when the power supply from the first system is stopped and then restarted; and
         the second write unit is activated when the request generation unit generates the write request and is not activated when receiving the write request from the user.

2. The data write device as set forth in claim 1, wherein the display device is a portable device which is removably attached to the data write device.

3. The data write device as set forth in claim 2, wherein the receiving unit receives the write request from the user through the portable device.

4. The data write device as set forth in claim 1, wherein the display device is a display lamp which is fixedly arranged in a vehicle.

5. The data write device as set forth in claim 1, wherein the receiving unit receives the write request from the user through a user operation unit which is fixedly arranged in a vehicle.

6. The data write device as set forth in claim 1, further comprising a control unit that performs idling stop control to automatically stop and restart an engine of a vehicle, wherein the target data is learning data regarding the idling stop control.

7. The data write device as set forth in claim 1, wherein the data write device is an electronic control device which is mounted in a vehicle.

8. A data write method of a data write device that receives power supply from a first system guided from a power source and writes data in a nonvolatile first storage unit, the data write method comprising:
- a request generation step of generating a write request to write data in the first storage unit under a predetermined condition;
- a receiving step of receiving the write request from a user;
- a first write step of writing target data stored in a second storage unit in the first storage unit in response to the write request, wherein the second storage unit receives power from a second system guided from the power source and is able to store data;
- a second write step of writing the target data stored in the second storage unit in the first storage unit if the power supply from the first system is stopped and then restarted at the time of writing by the first write unit; and
- a display control step of causing a display device to display a write result of the target data in the first storage unit, wherein
  - the display device carries out a predetermined initial display when the power supply from the first system is stopped and then restarted; and
  - the second write step is carried out when the request generation unit generates the write request and is not carried out when receiving the write request from the user.

* * * * *